United States Patent
Freitag et al.

(10) Patent No.: US 6,577,527 B2
(45) Date of Patent: Jun. 10, 2003

(54) METHOD FOR PREVENTING UNWANTED PROGRAMMING IN AN MRAM CONFIGURATION

(75) Inventors: Martin Freitag, München (DE); Stefan Lammers, Wappingers Falls, NY (US); Dietmar Gogl, Fishkill, NY (US); Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 09/999,324

(22) Filed: Oct. 31, 2001

(65) Prior Publication Data

US 2002/0085411 A1 Jul. 4, 2002

(30) Foreign Application Priority Data

Oct. 31, 2000 (DE) .......................................... 100 53 965

(51) Int. Cl.[7] .............................................. G11C 11/00
(52) U.S. Cl. ...................................... 365/158; 365/209
(58) Field of Search ........................... 365/158, 97, 209, 365/206

(56) References Cited

U.S. PATENT DOCUMENTS

| 3,593,325 A | * | 7/1971 | Salzmann .................... 365/173 |
| 5,039,655 A | * | 8/1991 | Pisharody .................... 365/161 |
| 6,404,671 B1 | * | 6/2002 | Reohr et al. ................. 365/158 |

FOREIGN PATENT DOCUMENTS

| DE | 1 524 770 | 5/1970 |
| WO | WO 99/14760 | 3/1999 |

* cited by examiner

*Primary Examiner*—Huan Hoang
(74) *Attorney, Agent, or Firm*—Laurence A. Greenberg; Werner H. Stemer; Ralph E. Locher

(57) ABSTRACT

Unwanted programming by stray magnetic fields is prevented in an MRAM configuration. Compensating currents that counteract the stray magnetic fields are strategically conducted through the MRAM configuration.

6 Claims, 3 Drawing Sheets

METHOD FOR PREVENTING UNWANTED PROGRAMMING IN AN MRAM CONFIGURATION

BACKGROUND OF THE INVENTION

FIELD OF THE INVENTION

The present invention relates to a method for preventing unwanted programming in an MRAM configuration (MRAM=magnetoresistive memory), in which memory cells in a memory cell array are situated in at least one plane at crossing points between word lines and bit lines. Programming currents are passed through the word lines, or programming lines, and bit lines associated with a selected memory cell and also produce a magnetic field in at least one memory cell which is adjacent to the selected memory cell. The magnetic field acts as a stray magnetic field in the adjacent memory cell.

FIG. 5 illustrates a so-called MTJ memory cell 1 (MTJ= Magnetic Tunnel Junction) at the crossing between a word line WL and a bit line BL running at right angles thereto. The MTJ memory cell comprises a multilayer system made up of a soft-magnetic layer (free magnetic layer) WML, a tunnel barrier layer or tunneling layer TL, and a hard-magnetic layer (permanent magnetic layer) HML. Information is then stored by changing or rotating the direction of magnetization of the soft-magnetic layer WML in relation to the direction of magnetization in the hard-magnetic layer HML. The magnetic fields required for changing the direction of magnetization in the soft-magnetic layer WML are produced by a current $I_{WL}$ in the word line WL and by a current $I_{BL}$ in the bit line BL. These magnetic fields interfere with one another at the crossing between the word line WL and the bit line BL. This is because, if the directions of magnetization in the two magnetic layers WML and HML are the same or parallel to one another, the MTJ memory cell 1 has a low resistance $R_C$, whereas, if the directions of magnetization in the magnetic layers WML and HML are not the same or are antiparallel, the resistance $R_C$ is high (cf. the equivalent circuit diagram in FIG. 6). This resistance change, illustrated schematically in FIG. 5 by an arrow ↑ or ↓ after the symbol "$R_C$", is utilized for the purpose of storing information. In this context, to rotate or change the direction of magnetization in the soft-magnetic layer WML, it is sufficient for it to be possible to change over the direction of at least one of the currents $I_{WL}$ and $I_{BL}$.

FIG. 6 is thus a schematic illustration of the MTJ memory cell 1 as a resistor $R_C$ between the bit line BL and the word line WL running perpendicularly thereto.

It becomes immediately obvious from FIGS. 5 and 6 that an extremely high storage density can be achieved in an MRAM configuration if a plurality of metallization systems with respective MTJ memory cells interposed are stacked above one another.

In this context, this stack can have three different array variants, shown schematically in FIGS. 7 to 9. In the variant shown in FIG. 7, the individual MTJ memory cells—illustrated by resistors—are arranged in a matrix directly between the word lines WL and the bit lines BL. In one such MRAM configuration, intense parasitic effects arise since, for a selected memory cell (cf. resistor in solid black), stray currents through memory cells connected to the selected word line or selected bit line cannot be avoided.

In the case of the array variants in FIGS. 8 and 9, a diode (FIG. 8) or a transistor (FIG. 9) is respectively connected in series with the individual MTJ memory cells. These array variants are much more complex, which is particularly true of the variant in FIG. 9, especially since, in that case, programming lines PRL, gate lines GL and source lines SL need to be provided in addition to the bit lines BL.

Irrespective of which of the array variants in FIGS. 7 to 9 is used for building a memory cell array for an MRAM configuration, when programming the memory cells, the appropriate bit line BL and word line WL (or programming line PRL in the array variant in FIG. 9) of the selected memory cell needs to have a respective current $I_{BL}$ or $I_{WL}$ (in a word line) impressed into it, so that the magnetic field resulting from these currents can program the selected MTJ memory cell at the crossing point between the two lines. This operation is shown schematically in FIG. 10, which illustrates crossing points between a word line WL1 and bit lines BL1, BL2 and BL3. In this case, if a current $I_{WL}$ flows through the word line BL1, and a current $I_{BL2}$ flows through the bit line BL2, then, by way of example, the magnetic field $H_{BL2}$ produced by the current $I_{BL2}$ does not just influence the MTJ memory cell $1_2$ at the crossing point between the bit line BL2 and the word line WL1. Rather, this magnetic field $H_{BL2}$ also affects the MTJ memory cells $1_1$ and $1_3$ between the bit lines BL1 and BL3, respectively, and the word line WL1, as is shown schematically in FIG. 10.

It is thus entirely possible for MTJ memory cells situated next to the actual selected MTJ memory cell in an MRAM configuration also to be reprogrammed by stray fields resulting from the currents in the selected word line or bit line, which is referred to as a programming fault or program disturb. This applies particularly to MRAM configurations forming the multilayer systems mentioned in the introduction, that is to say specifically to the currently generally desired and sought-after high-density memory arrays with a plurality of levels of conductor tracks and interposed MTJ memory cells. Such programming faults or program disturbs are extremely undesirable in this case.

SUMMARY OF THE INVENTION

It is accordingly an object of the invention to provide a method of avoiding undesirable programming in MRAM configurations, which overcomes the above-mentioned disadvantages of the heretofore-known devices and methods of this general type and which can be used as a reliable and simple means of preventing stray magnetic fields from reprogramming memory cells which are adjacent to a selected memory cell.

With the foregoing and other objects in view there is provided, in accordance with the invention, a method for preventing unwanted programming in an MRAM configuration in which memory cells of a memory cell array are situated in one or more levels at crossing points between word lines and bit lines, and the memory is programmed by passing programming currents through a word line and a bit line associated with a selected memory cell to produce a given magnetic field in the selected memory cell. The method comprises:

conducting a compensating current in the memory cell array for producing a compensating magnetic field counteracting a stray magnetic field produced by the programming currents in at least one memory cell adjacent the selected memory cell.

In accordance with an added feature of the invention, the compensating current is conducted through a word line and/or a bit line associated with the at least one adjacent memory cell, or through a separate line, and the compensating current induces the compensating magnetic field counteracting the stray magnetic field.

In accordance with an additional feature of the invention, compensating currents are impressed in a respective bit line disposed next but one to a selected bit line.

In accordance with another feature of the invention, the compensating current is set to a lower value than the programming current.

In other words, the invention achieves the above objects for a method of the type mentioned in the introduction by virtue of the word line, i.e., programming line, or bit line or a separate line of the at least one adjacent memory cell carrying a current which yields a compensating magnetic field counteracting the stray magnetic field.

Hence, the inventive method uses compensating magnetic fields to prevent stray magnetic fields from influencing memory cells, which are adjacent to a programming memory cell in MRAM configurations. These compensating magnetic fields are, for their part, produced by compensating currents flowing directly in the appropriate bit lines or word lines, or programming lines, of the adjacent memory cells or else in separate lines running next to the memory cells at risk. The inventive method thus allows programming faults or program disturbs to be reliably prevented in memory cells, which are at risk.

In accordance with a further feature of the invention, the memory cell array is disposed in a multiplayer system and the conducting step comprises impressing compensating currents in word lines or bit lines in a plurality of planes.

In accordance with a concomitant feature of the invention, the level of the compensating current is advantageously controlled with self-adjusting circuits.

The novel method is particularly advantageous when it is applied to multilayer systems since, in these systems, the occurrence of stray magnetic fields is particularly problematical on account of the fact that the individual layers are very close to one another.

Other features which are considered as characteristic for the invention are set forth in the appended claims.

Although the invention is illustrated and described herein as embodied in a method for preventing unwanted programming in an MRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

It will be appreciated that the magnetic fields in FIGS. 1, 2, 4, and 10 are illustrated in circular form for reasons of simplified illustration. On account of the generally rectangular conductor cross sections for the bit lines and word lines, and on account of the interference between various magnetic fields as a result of the currents through the bit lines and word lines, much more complex magnetic field distributions are produced in reality. However, this in no way changes the fact that, in principle, similar conditions obtain for these more complex magnetic field distributions, as the circular magnetic fields are intended to illustrate.

Figure 1:
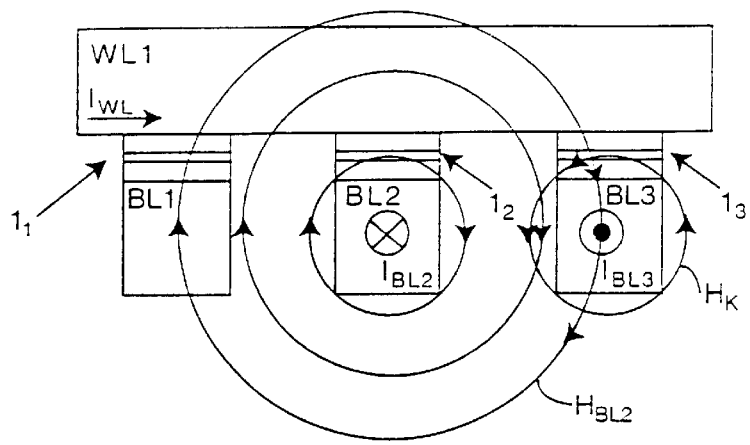
FIG. 1 is a schematic illustration explaining how programming faults in an MTJ memory cell are eliminated by a compensating magnetic field in accordance with a first exemplary embodiment of the invention.
Figure 10:
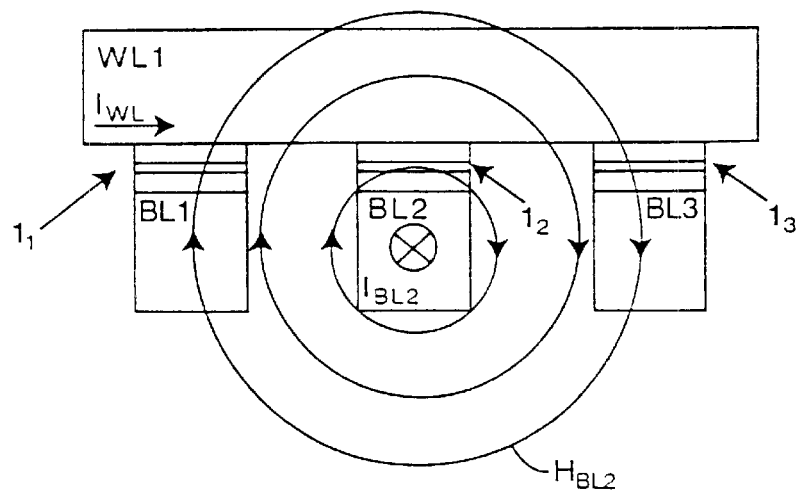
FIG. 10 is a schematic view of a portion of a prior art memory configuration.

Referring now once more to the figures of the drawing in detail, it is assumed, in the exemplary embodiment in FIG. 1, and similarly in the configuration of FIG. 10, that the MTJ memory cell 12 at the crossing between the bit line BL2 and the word line WL1 is to be programmed. This is now done as a result of interference between the magnetic fields produced by the programming currents $I_{WL}$ in the word line WL1 and $I_{BL2}$ in the bit line BL2. As in FIG. 10, FIG. 1 shows only the magnetic field $H_{BL2}$ produced by the programming current $I_{BL2}$ flowing into the plane of the drawing in the bit line BL2. This current $I_{BL2}$ produces intense parallel magnetic field components in the layer system of the MTJ memory cell $1_2$ at the crossing between the bit line BL2 and the word line WL1. Together with the magnetic field yielded by the word line current $I_{WL}$, this programs the MTJ memory cell $1_2$.

The current $I_{BL2}$ flowing through the bit line BL2 also produces stray magnetic fields in the regions where the bit line BL1 and the bit line BL3 cross the word line WL1, however. These stray magnetic fields can have an unwanted influence on the MTJ memory cells $1_1$ and $1_3$ situated at these crossings, so that programming faults or "program disturbs" arise here. These faults are produced even though the parallel magnetic field components in the region of these adjacent MTJ memory cells $1_1$ and $1_3$ are much smaller than the parallel magnetic field component in the region of the MTJ memory cell $1_2$ to be programmed.

Figure 7:
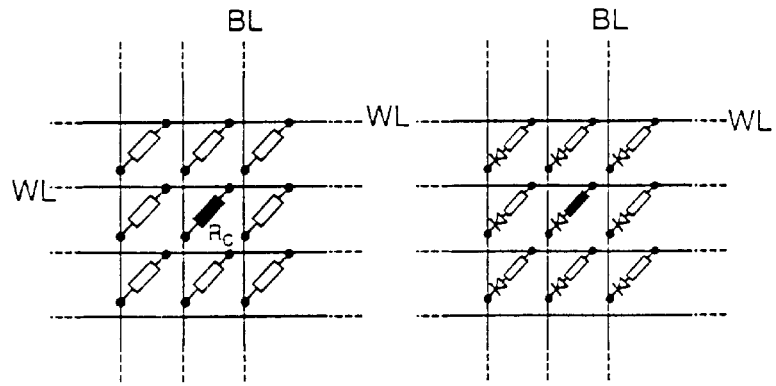
FIGS. 7 to 9 are schematic diagrams showing different array variants for MRAM configurations.
Figure 8:
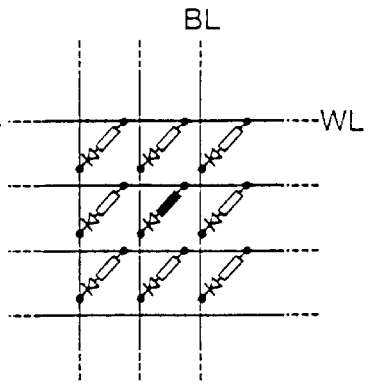
Figure 9:
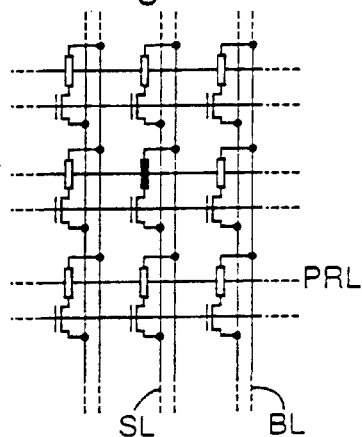

In order, then, to prevent such programming errors in the region of the adjacent MTJ memory cells $1_1$ and $1_3$, compensating magnetic fields can be used by passing, for example, an appropriate compensating current $I_{BL3}$ through the bit line BL3, as shown schematically in FIG. 1. The compensating magnetic field produced by this compensating current $I_{BL3}$ allows the parallel magnetic field components in the MTJ memory cell $1_3$ to be virtually eliminated. The same applies for the MTJ memory cell $1_1$. A compensating magnetic field may possibly also be produced by a separate line L running next to the bit line BL, which is subject to the stray magnetic field (cf. FIG. 7).

Figure 2:
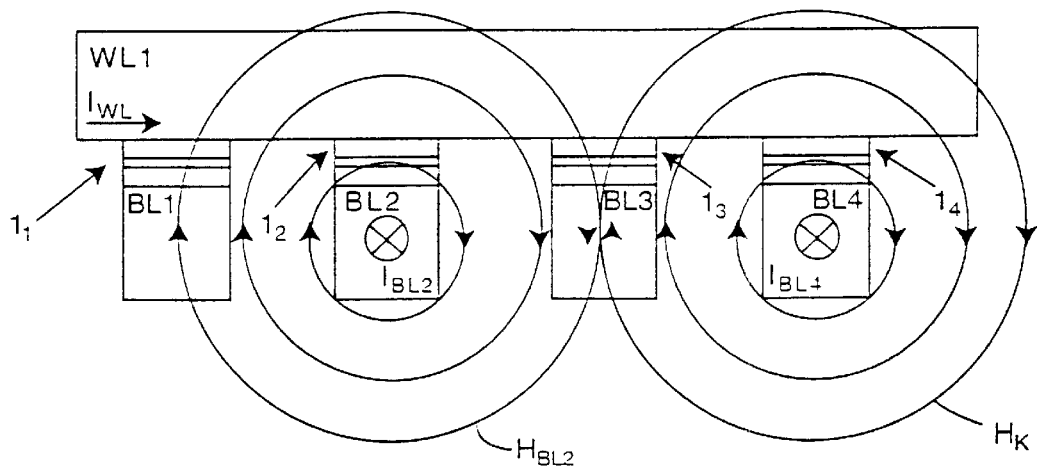
FIG. 2 is a schematic illustration explaining how programming faults in an MTJ memory element are eliminated by compensating currents in accordance with a second exemplary embodiment of the invention.

Another exemplary embodiment of the inventive method is shown in FIG. 2. In this exemplary embodiment, in which, as in the exemplary embodiment shown in FIG. 1, a programming current $I_{BL2}$ flowing in the bit line BL2 produces stray magnetic fields in the region of the MTJ memory cells $1_1$ and $1_3$, a bit line BL4 and possibly further adjacent bit lines has/have a current impressed into it/them which reduces the stray magnetic field, resulting from the current $I_{BL2}$, in the bit line BL3 to such an extent that the programming current $I_{BL2}$ in the bit line BL2 does not produce a programming fault in the MTJ memory cell $1_3$ between the bit line BL3 and the word line WL1. However, the current $I_{BL4}$, yielding the compensating magnetic field, in the bit line BL4 should not be so large that the parallel stray magnetic field components in the MTJ memory cell $1_3$ are eliminated completely, since otherwise the MTJ memory cell $1_4$ between the bit line BL4 and the word line WL1 would also be programmed. Hence, in this case, the stray magnetic field produced by the programming current $I_{BL2}$ can "only" be weakened in the MTJ memory cell $1_3$, although this is entirely sufficient for use in practice.

Figure 3:
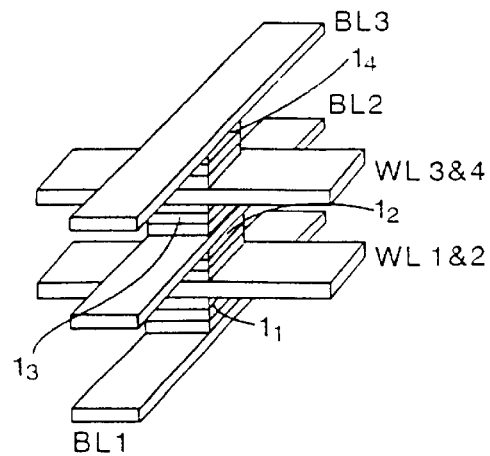
FIG. 3 is a perspective view of a multilayer system.

FIG. 3 shows how bit lines BL1, BL2 and BL3 interact with word lines WL1 & 2 and WL3 & 4 in a multilayer system. MTJ memory cells $1_1$, $1_2$, $1_3$ and $1_4$ are thus situated between the bit line BL1 and the word line WL1 & 2, the word line WL1 & 2 and the bit line BL2, the bit line BL2 and the word line WL3 & 4 and between the word line WL3 & 4 and the bit line BL3.

Figure 4:
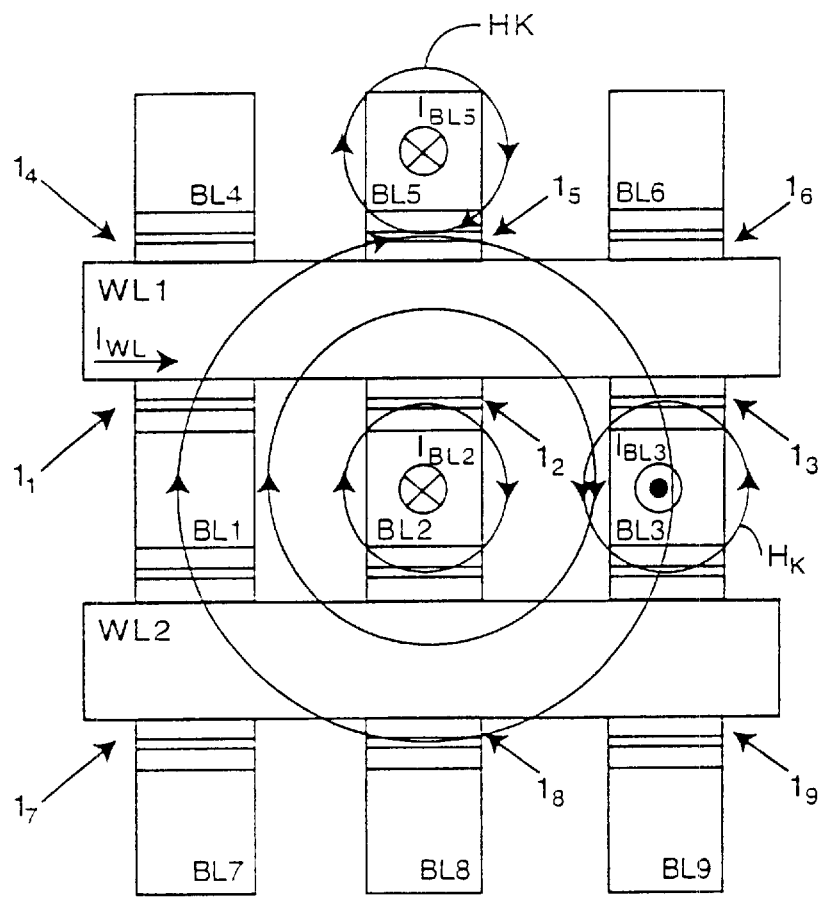
FIG. 4 is a schematic illustration explaining how programming faults in a multilayer system are eliminated by compensating currents in accordance with a third exemplary embodiment of the invention.
Figure 5:
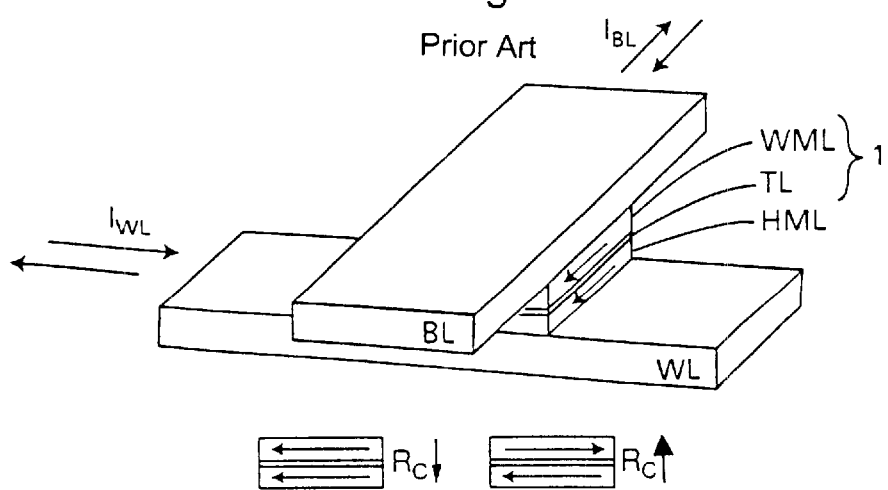
FIG. 5 is a perspective view of a conventional MTJ memory cell between a bit line and a word line.
Figure 6:
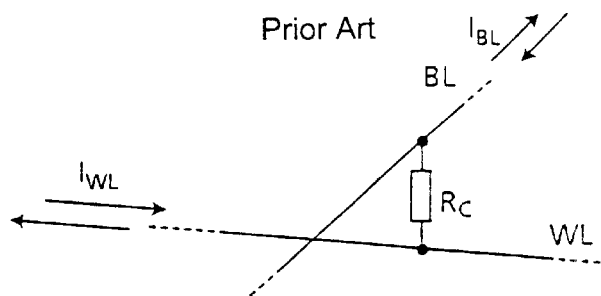
FIG. 6 is a diagram of an equivalent circuit for the MTJ memory cell shown in FIG. 5.

FIG. 4 is a schematic illustration of the layout of such a multilayer system. For the exemplary embodiment explained with reference to FIG. 4, too, it is to be assumed that the MTJ memory cell $1_2$ between the word line WL1 and the bit line BL2 can be programmed by programming currents in the word line WL1 and in the bit line BL2. In this case, as in the case of the exemplary embodiment shown in FIG. 1, programming faults in the MTJ memory cell $1_3$ can be prevented by an appropriate compensating current $I_{BL3}$ in the bit line BL3, in order to use a compensating magnetic field to compensate for a parallel stray magnetic field component in the region of the MTJ memory cell $1_3$.

However, the circumstances in an MTJ memory cell $1_5$, situated in another plane, between the word line WL1 and the bit line BL5 are more critical: although the MTJ memory cell $1_5$ and the MTJ memory cell $1_3$ are at a similar distance from the bit line BL2, a programming current $I_{BL2}$ flowing in the bit line BL2 means that much more intense parallel magnetic field components are active in the MTJ memory cell $1_5$ than in the MTJ memory cell $1_3$, so that the risk of programming faults is much greater in the MTJ memory cell $1_5$ than in the MTJ memory cell $1_3$. These programming faults can easily be prevented by the invention, however, by passing an appropriate compensating current $I_{BL5}$ through the bit line BL5, which produces a compensating magnetic field that eliminates the stray magnetic field, resulting from the current $I_{BL2}$, in the MTJ memory cell $1_5$, as indicated schematically in FIG. 4.

The exemplary embodiment shown in FIG. 4 clearly shows the significance of current compensation in accordance with the inventive method in multilayer systems. In this context, it is naturally also possible for compensating currents to be passed through further lines for compensating purposes.

According to the invention, lines which are adjacent to a selected line can have currents passed through them which also support the programming operation in the selected memory cell, for example if this affords advantages in terms of better selectivity. It is also possible for compensating currents to be adjusted by self-aligning circuits, for example in order for this to eliminate effects of process variations in the manufacture of the MRAM configuration.

We claim:

1. A method for preventing unwanted programming in an MRAM configuration, wherein memory cells of a memory cell array are situated at crossing points between word lines and bit lines, the method which comprises:

passing programming currents through a word line and a bit line associated with a selected memory cell to produce a given magnetic field in the selected memory cell; and conducting a compensating current in the memory cell array for producing a compensating magnetic field counteracting a stray magnetic field produced by the programming currents in at least one memory cell adjacent the selected memory cell.

2. The method according to claim 1, wherein the conducting step comprises conducting the compensating current through a line selected from the group consisting of a word line associated with the at least one adjacent memory cell, a bit line associated with the at least one adjacent memory cell, and a separate line for inducing the compensating magnetic field counteracting the stray magnetic field.

3. The method according to claim 1, wherein the conducting step comprises impressing compensating currents in a respective bit line disposed next but one to a selected bit line.

4. The method according to claim 3, which comprises setting the compensating current at a lower intensity than the programming current.

5. The method according to claim 1, wherein the memory cell array is disposed in a multiplayer system and the conducting step comprises impressing compensating currents in word lines or bit lines in a plurality of planes.

6. The method according to claim 1, which comprises controlling a level of the compensating current by self-adjusting circuits.

* * * * *